United States Patent
Yao et al.

(10) Patent No.: US 10,567,309 B2
(45) Date of Patent: Feb. 18, 2020

(54) SWITCH WITH SIDE PORT

(71) Applicant: Facebook, Inc., Menlo Park, CA (US)

(72) Inventors: Zhiping Yao, Dublin, CA (US); Che Kin Leung, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/726,343

(22) Filed: Oct. 5, 2017

(65) Prior Publication Data
US 2019/0109800 A1  Apr. 11, 2019

(51) Int. Cl.
*H04L 12/931* (2013.01)
(52) U.S. Cl.
CPC ..................... *H04L 49/40* (2013.01)
(58) Field of Classification Search
CPC ........................................... H04L 49/40
See application file for complete search history.

(56) References Cited

U.S. PATENT DOCUMENTS

| | | | |
|---|---|---|---|
| 6,373,840 B1* | 4/2002 | Chen | H04L 49/351 370/360 |
| 6,600,727 B1* | 7/2003 | Mackay | H04B 3/60 370/276 |
| 6,785,286 B1* | 8/2004 | O'Keeffe | H04L 43/00 370/397 |

* cited by examiner

*Primary Examiner* — Steven H Nguyen
(74) *Attorney, Agent, or Firm* — Van Pelt, Yi & James LLP

(57) ABSTRACT

Data center switches are described. A rack of a data center can include several switches to implement a network topology. The switches can include ports on their fronts and sides such that cables can be coupled with these side ports to implement the network topology.

22 Claims, 5 Drawing Sheets

Place first switch within network rack ⟶ 505

Place second switch within network rack ⟶ 510

Couple cables with ports on the fronts of the first and second switches ⟶ 515

Couple cables with ports on the sides of the first and second switches ⟶ 520

SWITCH WITH SIDE PORT

TECHNICAL FIELD

This disclosure relates to a switch with side ports to implement a switch network topology among switches of a rack for data center configurations.

BACKGROUND

Data centers can include a large number of switches directing data (e.g., formatted within a network packet) among a large number of servers. These switches and servers are often mounted within racks, and the data centers can include hundreds, thousands, or more racks.

The interconnect coupling the switches to each other and, therefore, directing data to the servers can be based on a variety of architectures or network topologies. For example, a Clos network includes coupling switches in a multi-stage hierarchy to provide non-blocking functionality such that any input can be provided to any output while reducing the number of ports. A butterfly network includes organizing switches within "ranks" and coupling a switch in one rank with two switches in an adjacent rank. This can result in fewer switches used, but the butterfly network is a blocking network. Thus, different network topologies can provide different advantages and disadvantages.

The switches within the racks can include printed circuit boards (PCBs) having traces, or interconnects, routing ports on the front of the switch (e.g., a port that is accessible from the front side of rack when the switch is within the rack) to a switch application-specific integrated circuit (ASIC) that can route data among the ports and, therefore, among other switches, servers, and other equipment within the data center implementing the network topology. Thus, to implement the network topology, the ports of the switches within the same or different racks can be coupled together with cables. The length of the traces on the PCB coupling the switch ASIC with the ports can provide a limitation to the length of the corresponding cables that are coupled with the ports to implement the network topology. For example, a longer trace on the PCB results in a shorter cable due to issues such as signal integrity (SI).

DETAILED DESCRIPTION

Figure 1:
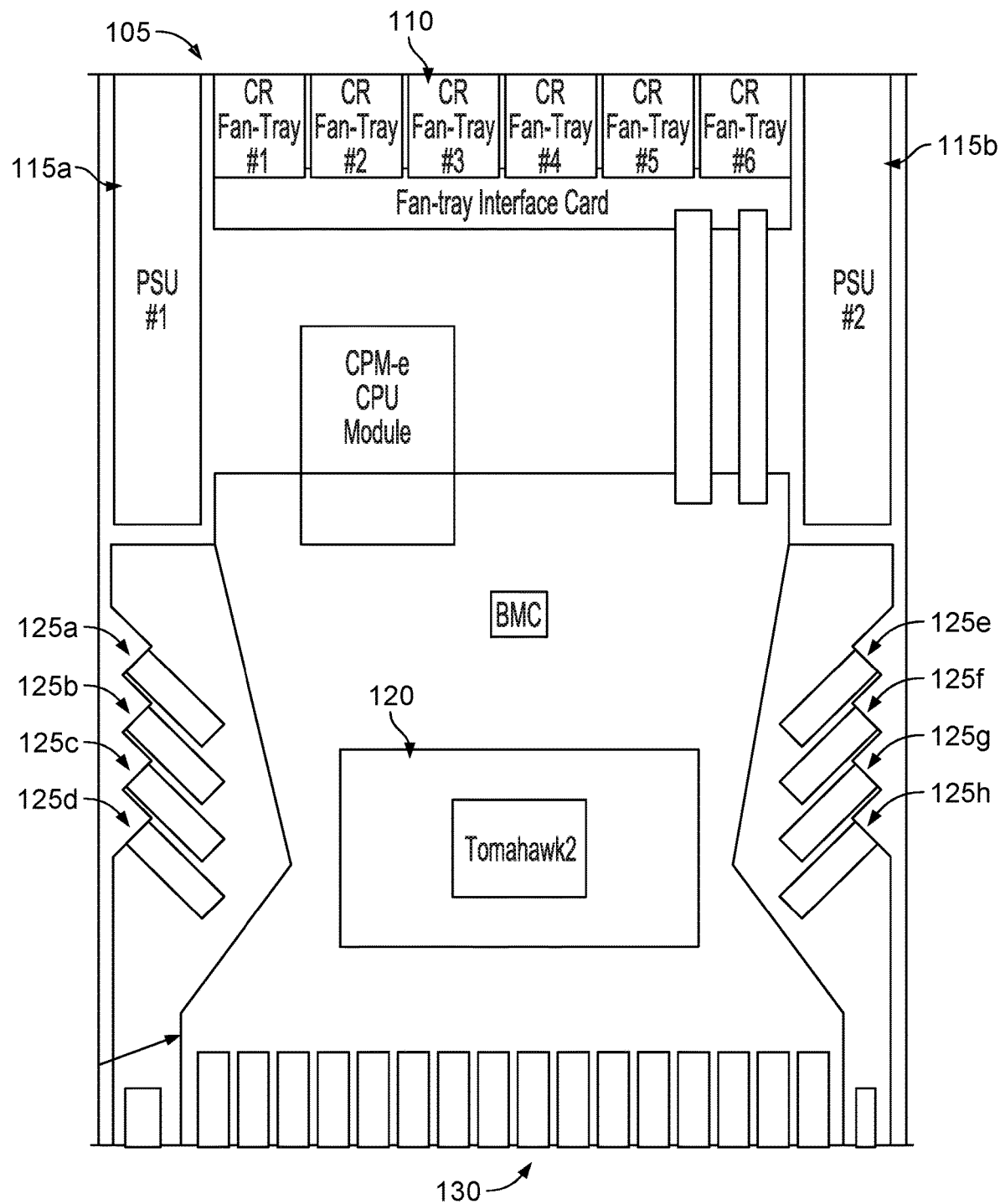
FIG. 1 illustrates an example of a switch with side ports.

Some of the material described in this disclosure includes systems and techniques for implementing a switch with side ports. In one example, a switch can include a printed circuit board (PCB) having a switch application-specific integrated circuit (ASIC) assembled upon it. The switch can also include ports used to couple copper or fiber optic cabling with other ports (e.g., of other switches) to implement a network topology. Some of the ports can be on a front-side of the switch. That is, some of the ports of the switch can be arranged on a housing of the switch such that the ports are exposed on the front side of a rack when the switch is housed within the rack. Traces, or interconnect, upon the PCB can couple the ports on the front-side of the switch with input/output (I/O) of the switch ASIC. Additionally, the switch can include side ports on the sides of the switch. That is, some of the ports of the switch can be arranged on the left-side and right-side of the switch. Because the side ports are closer to the switch ASIC, the traces or interconnect between the side ports and the I/O of the switch ASIC upon the PCB can be shorter in length than the interconnect between the front ports and the I/O of the switch ASIC. This can result in being able to use longer cabling with the side ports to implement the network topology because a shorter length of the interconnect upon the PCB can result in better signal integrity (SI). Moreover, the side ports can be implemented with larger, higher data rate ports than the front-side ports.

In more detail, data centers can include racks providing a physical structure (e.g., an enclosure, housing, frame, etc.) for mounting devices such as switches, servers, and other networking equipment. A data center can include thousands of racks and, therefore, thousands of switches and servers.

The individual switches within a single rack or among multiple racks can be coupled together with cables as interconnect (e.g., optical fiber, copper cabling, or other types of cables) to implement a larger network of switches, or switch network (or network switch). The arrangement of the interconnect among the individual switches can define a network topology or architecture of the larger switch network. For example, a Clos network can include a multi-stage hierarchy of switches that are coupled together in an arrangement that is different than a butterfly network. Other types of network topologies can include mesh (e.g., full mesh), tree, and many others. Additionally, the switch networks can be of different sizes. For example, one Clos network might use more switches than another Clos network to provide a larger switch network composed of the individual switches within the racks.

The different topologies allow for different advantages and disadvantages. For example, some switch networks (e.g., Clos networks) are non-blocking such that any input can be provided to any output. Others might not be non-blocking (i.e., some inputs can only be routed to certain outputs), but might provide other advantages such as speed, reduced cost due to using fewer switches, etc.

FIG. 1 illustrates an example of a switch with side ports. Switch 105 can be a switch that can be used with other switches to implement a switch network in accordance with a network topology. Switch 105 in FIG. 1 includes fans 110 to provide cooling as the various components generate heat, power supplies 115a and 115b to power the various components, and switch ASIC 120. Switch ASIC 120 can be used to route data (e.g., packets) among side ports 125a-h and front ports 130. The data can be routed from one port to another of switch 105 based on a destination of the data and the network topology that the switch is partly implementing. Such routing can be performed by switch ASIC 120.

Switch ASIC 120 can be assembled upon a PCB, for example, soldered, surface mounted, etc. The PCB can include traces, or interconnect, coupling the various I/Os of switch ASIC 120 with corresponding ports. For example, side port 125a can be coupled with switch ASIC 120 via one interconnect. One of the front switches 130 can be coupled with switch ASIC 120 via another interconnect. Thus, each of the ports can be coupled with a corresponding I/O of switch ASIC 120, resulting in data received by switch ASIC 120 on one port to be analyzed and then routed to another port by switch 120.

As depicted in FIG. 1, there are four side ports on each side of switch 105. For example, side ports 125a-d are on one side of switch 105 (e.g., on the left side of switch 105 if it is inserted into a rack). Side ports 125e-f are on the other side of switch 105 (e.g., on the right side of switch 105 if it is inserted into a rack). Front ports 130 include sixteen ports on the front side that can be exposed to a user or technician servicing a rack that houses switch 105.

Side switches 125a-h can be closer in distance to switch ASIC 120 than front ports 130. For example, the interconnect or trace on the PCB from side port 125a to an I/O of switch ASIC 120 can be shorter in length than the interconnect or trace on the PCB from one of the front ports 130 to an I/O of switch ASIC 120. This results in better signal integrity for the signals propagating via side ports 125a-h than front ports 130 because there is less signal loss for a shorter interconnect on a PCB. Additionally, due to the better signal integrity, the cables coupled with side ports 125a-h can be longer than the cables coupled with front ports 130. For example, a cable coupling side port 125a to a side port of another switch can be longer than a cable coupling one of front ports 130 to another port.

Thus, a shorter interconnect or trace on the PCB associated with a port results in being able to user a longer cable attached to the port coupling the switch to another switch (or a port of that switch to another port of the same switch). This can be beneficial because some network topologies might involve coupling ports of switches that might be arranged in the same rack some distance apart from each other, or even switches among different racks. If the distance between the switches is long, then longer cables are useful to be able to fulfill the couplings and implement the desired network topology. In a simplified example, an interconnect or trace that is one inch smaller than another interconnect or trace can result in the corresponding cable coupling the port to another port to be one foot longer in length. Thus, as previously discussed, reducing the length of the interconnect upon the PCB can allow for longer cables.

If the rack that switch 105 with side ports 125a-h is inserted within includes space along the sides (e.g., fifteen inches of space between switch 105 and the housing of the rack or other components housed within the rack), then the cables for side ports 125a-h can be inserted into the corresponding ports. The cables can then be routed along the sides and back of the rack. In other scenarios, some racks might use cooling components such as fans 110 along the sides and, therefore, side ports 125a-h would not be able to be implemented. By contrast, the implementations described herein preserve space along the sides of the racks next to switch 105 to allow for side ports 125a-h and corresponding cabling.

In some implementations, front ports 130 can be Quad Small Form-factor Pluggable (QSFP) ports used for data communications within the data center. However, side ports 125a-h can be QSFP double density (QSFP-DD) ports which can be larger in size than the QSFP front ports 130 (e.g., providing eight lane electrical interfaces rather than four lane electrical interfaces of QSFP), but also support a higher data rate (e.g., double the data rate, or a higher bandwidth). Thus, side ports 125a-h can support higher bitrates than front ports 130, for example, 25 gigabits per second due to the shorter interconnects upon the PCB and being able to use larger ports along the sides.

Figure 2:
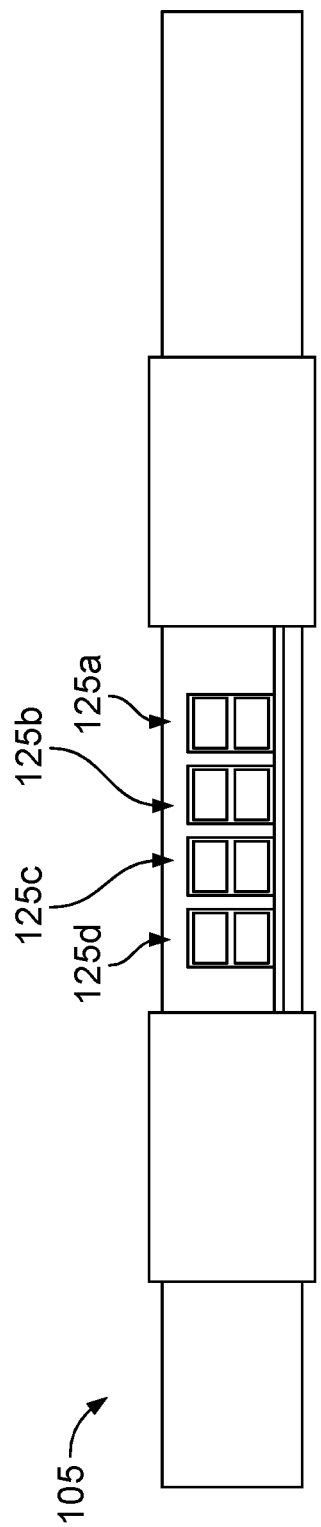
FIG. 2 illustrates an example of side ports of a switch.

FIG. 2 illustrates an example of side ports of a switch. In FIG. 2, a side view of switch 105 is portrayed showing side ports 125a-d accessible via the side. This allows for cables to couple with the ports along the side, as previously discussed.

Figure 3:
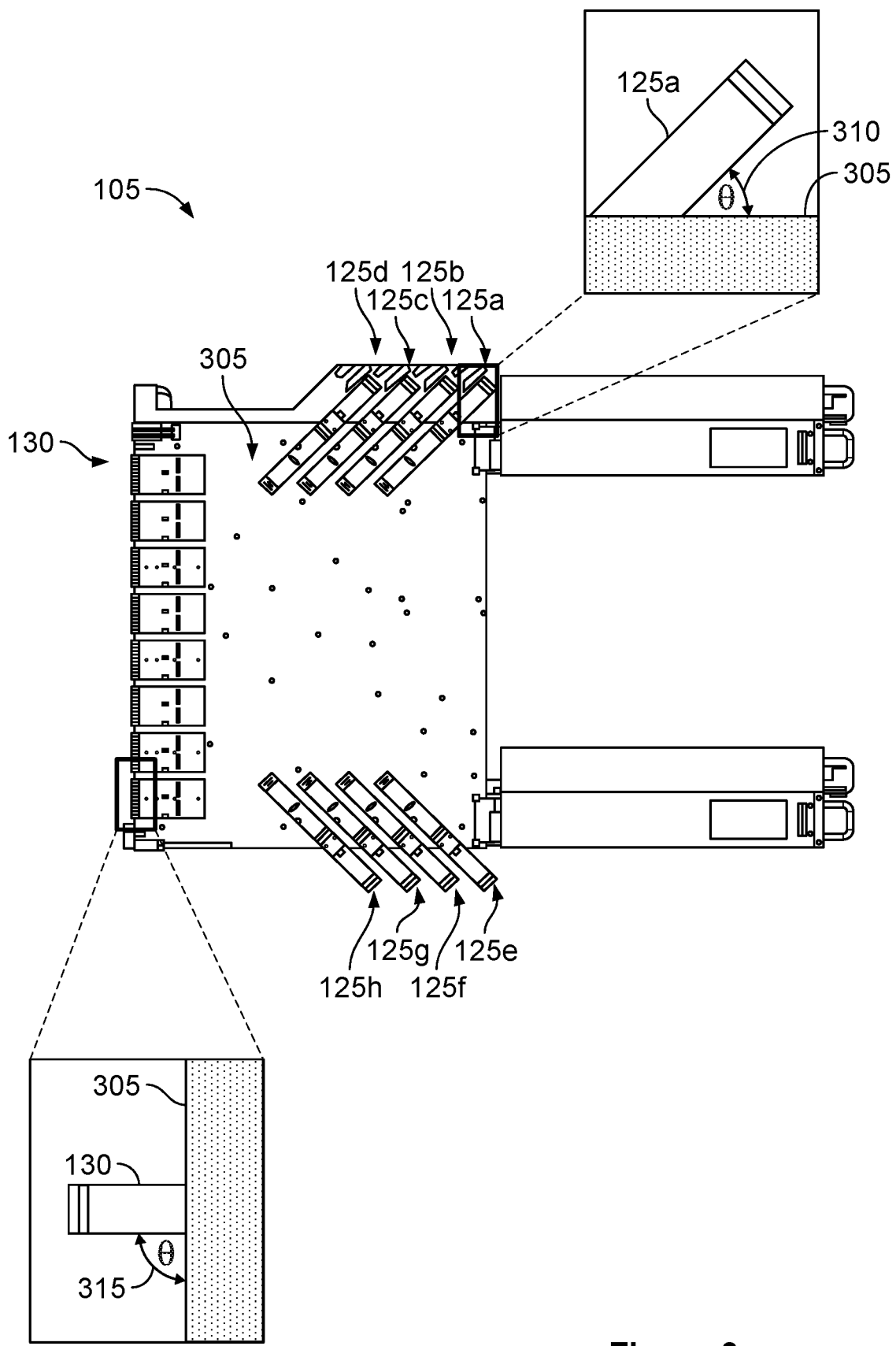
FIG. 3 illustrates an example of angled side ports of a switch.

In some implementations, side ports 125a-g can be angled to allow for cables to be coupled with the ports via a back side of the network rack housing switch 105. FIG. 3 illustrates an example of angled side ports of a switch. In FIG. 3, side ports 125a-h can be mounted upon PCB 305 (which can include switch ASIC 120) at an angle to allow for easy access for cables from the back side of switch 105 and the rack that it is to be housed within. For example, as depicted, angle 310 of side port 125a with respect to PCB 305 can be different than angle 315 between one of front ports 130 and a different edge of PCB 305. That is, in contrast with front ports 130 which are mounted at ninety degree angles to the edge of PCB 305, side ports 125a-h can be mounted at different angles such as forty-five degrees with respect to the edge of PCB 305. For example, the portion of side port 125a that a cable plugs into can be closer to the back side of switch 105 (or the back side of the rack housing switch 105) than the portion of side port 125a that is mounted upon PCB 305. However, in other implementations, the angle can be reversed such that side ports 125a-h can be accessible from the same side as front ports 130.

Figure 4:
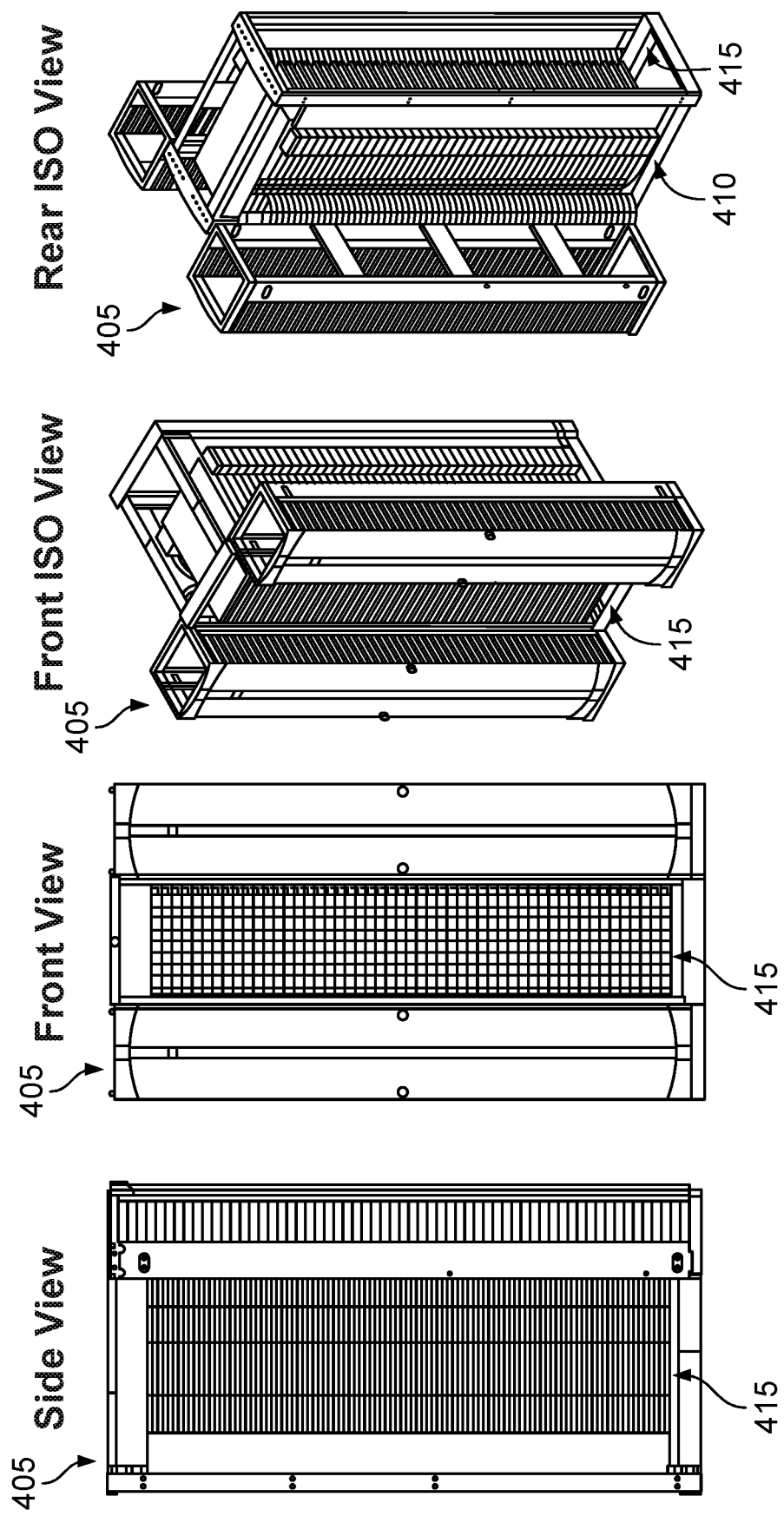
FIG. 4 illustrates an example of a rack housing switches with side ports.

FIG. 4 illustrates an example of a rack housing switches with side ports. As depicted in FIG. 4, rack 405 can include several switches 415 with side ports (e.g., 48 switches). In FIG. 4, the sides of the switches are accessible from the rear, allowing for cables to be easily plugged into side ports 410 (e.g., side ports 125a-h) from the rear of rack 410, as previously discussed. Additionally, rack 405 includes space (e.g., an air gap) along the sides of switches 415 (e.g., including switch 105) to allow for side ports 410 and the corresponding cables. Thus, the cables can be placed or arranged to couple with side ports 410 and be between a wall of rack 405 (e.g., the housing or enclosure of rack 405) and switches 415. In one example, rack 405 can be nineteen inches wind to hold many switches 105, for example, forty-eight switches. Thus, switch 105 of FIG. 1 can be used as a "building-block" to implement network topologies using groupings of switches within racks 405.

The switches and racks disclosed herein can also allow for a large, scalable network switch. For example, Clos, cross-connect, full mesh, cube, butterfly, tree, and other types of network topologies can be more easily implemented and made larger and more scalable due to being able to use longer cables to couple ports of switches. Additionally, the systems and techniques described herein can reduce power consumption of rack 405 because fewer active components are used due to the reduced signal loss and better signal integrity. The switches disclosed herein can also result in an easier-to-design rack, for example, by reducing the mechanical design of cable backplanes.

In some implementations, the cabling to couple different ports of switches can be a Direct Attach Copper (DAC) cable.

Many of the examples described herein include a switch ASIC. However, the switch circuit implemented by the switch ASIC can also be implemented by other types of circuits, for example, programmable logic devices including field programmable gate arrays (FPGAs), structured ASICs, processors, etc.

Figure 5:
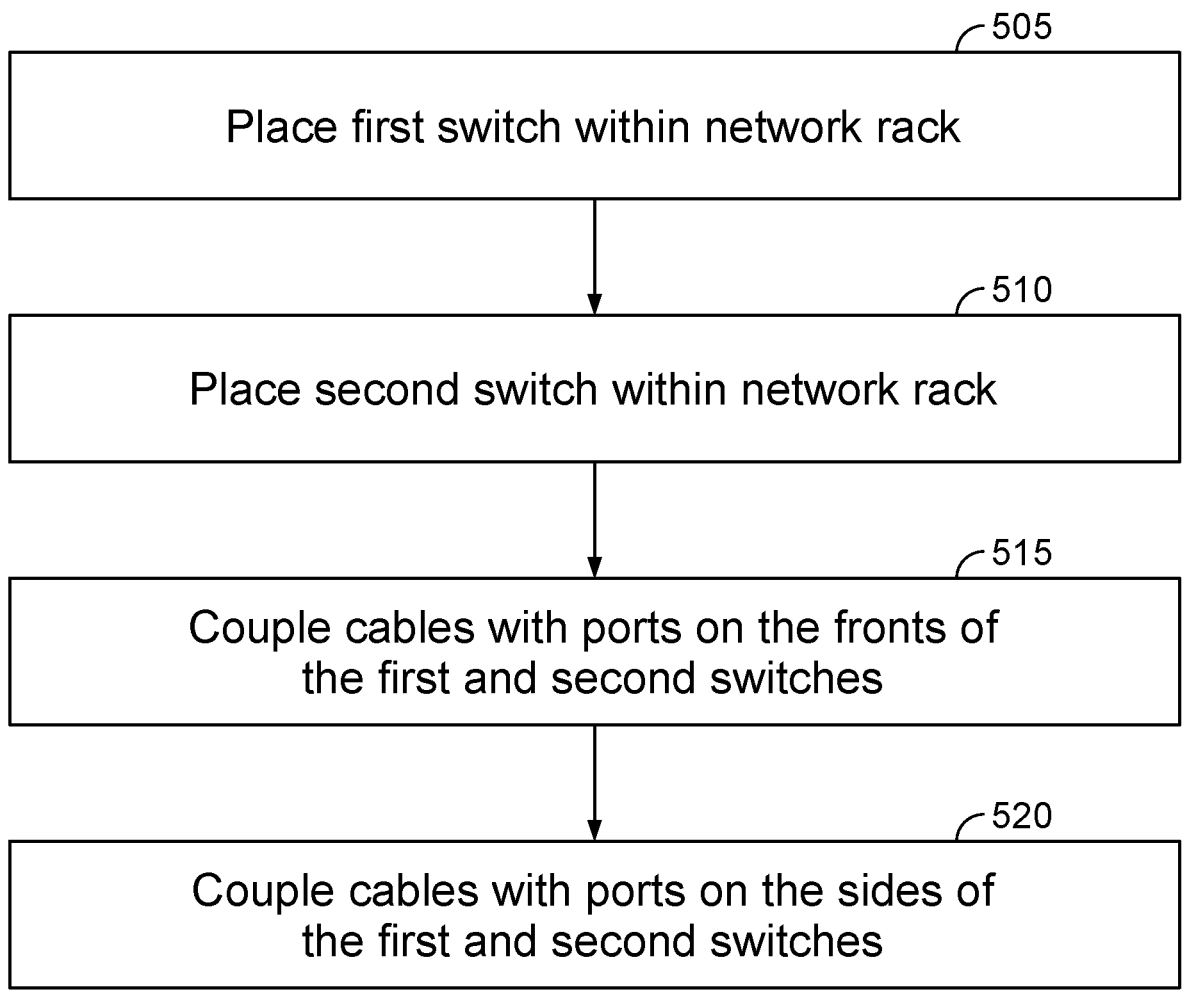
FIG. 5 illustrates an example of a block diagram for using side ports of switches.

FIG. 5 illustrates an example of a block diagram for using side ports of switches. In FIG. 5, a first switch can be placed within a network rack (505). For example, switch 105 in FIG. 1 can be placed within rack 405 in FIG. 4. Another switch can also be placed within the network rack (510). For example, another switch 105 can be placed within rack 405 to implement a network topology, as previously discussed. To implement that network topology, cables can be coupled with ports on the fronts of the switches (515) as well as ports on the sides of the switches (520). For example, cables can be coupled with side ports 125*a-h* of switch 105 in FIG. 1.

From the foregoing, it will be appreciated that specific embodiments of the invention have been described herein for purposes of illustration, but that various modifications may be made without deviating from the scope of the invention. Accordingly, the invention is not limited except as by the appended claims.

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one implementation," "an implementation," "one embodiment," or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Those skilled in the art will appreciate that the logic illustrated in each of the flow diagrams discussed above, may be altered in various ways. For example, the order of the logic may be rearranged, substeps may be performed in parallel, illustrated logic may be omitted; other logic may be included, etc.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

We claim:

1. A network rack, comprising:
   a first switch having a front, a back, and first side joining the front to the back and a second side joining the front to the back, wherein the first switch has a first front port on the front and a second port on the first side;
   a second switch having a front, a back, and first side joining the front to the back and a second side joining the front to the back, wherein the second switch has a first front port on the front of the second switch and a second port on the first side of the second switch;
   a first cable coupling the first front port on the front of the first switch with the first front port on the front of the second switch; and
   a second cable coupling the second port on the first side of the first switch with the second port on the first side of the second switch.

2. The network rack of claim 1, wherein the first cable has a first length, the second cable has a second length, the second length being longer than the first length.

3. The network rack of claim 1, wherein the first switch includes a switch circuit on a printed circuit board (PCB), wherein a first interconnect couples the first port on the front of the first switch with the switch circuit, a second interconnect couples the second port on the first side of the first switch with the switch circuit, the first interconnect having a first length, the second interconnect having a second length, the second length being shorter than the first length.

4. The network rack of claim 1, wherein the first port on the front of the first switch and the first port on the front of the second switch correspond to a first data rate, the second port on the first side of the first switch and the second port on the first side of the second switch correspond to a second data rate, the first data rate and the second data rate being different data rates.

5. The network rack of claim 4, wherein the second data rate is higher than the first data rate.

6. The network rack of claim 1, wherein the second cable coupling the second port on the first side of the first switch with the second on the first side of the second switch is arranged between a wall of the network rack and the first switch.

7. The network rack of claim 1, wherein the second port on the first side of the first switch is oriented on the first switch such that a portion of the second port that the second cable plugs into is closer to the back of the first switch than an opposite portion of the second port.

8. The network rack of claim 1, wherein the first cable and the second cable include copper cabling.

9. The network rack of claim 1, wherein the first cable and the second cable include optical fiber.

10. A switch including:
    a front;
    a back;
    a first side joining the front to the back;
    a second side joining the front to the back;

a first front port on the front of the switch, wherein the first front port is configured to receive a first cable coupling the first front port with a front port on another switch and the first front port corresponds to a first data rate; and a second port on the first side of the switch wherein the second port is configured to receive a second cable coupling the second port with a side port on another switch and the second port corresponds to a second data rate faster than the first data rate.

11. The switch of claim 10, wherein the switch is configured to have a first cable coupled to the first port on the front of the switch, and a second cable coupled to the second port on the first side of the switch, the first cable having a first length, the second cable having a second length, the second length being longer than the first length.

12. The switch of claim 11, wherein the first cable and the second cable include copper cabling.

13. The switch of claim 11, wherein the first cable and the second cable include optical fiber.

14. The switch of claim 10, wherein the switch includes a switch circuit, wherein a first interconnect couples the first port on the front of the switch with the switch circuit, a second interconnect couples the second port on the first side of the switch with the switch circuit, the first interconnect having a first length, the second interconnect having a second length, the second length being shorter than the first length.

15. The switch of claim 10, wherein the first port on the front of the switch corresponds to a first data rate, the second port on the first side of the switch corresponds to a second data rate, the first data rate and the second data rate being different data rates.

16. The switch of claim 15, wherein the second data rate is higher than the first data rate.

17. The switch of claim 10, wherein the second port on the first side of the switch is angled towards a back side of the switch and first front port and the second port are oriented at an angle to each other.

18. A method comprising:
placing a first switch within a network rack, the first switch having a front, a back, and first side joining the front to the back and a second side joining the front to the back, wherein the first switch has a first front port and a second port on the first side;

placing a second switch within the network rack, the second switch having a first front port on a front of the second switch, and a having a front, a back, and first side joining the front to the back and a second side joining the front to the back, wherein the second switch has as first front port on the front of the second switch and a second port on the first side of the second switch;

coupling a first cable with the first front port of the first switch and the first front port of the second switch; and coupling a second cable with the second port on the first side of the first switch and the second port on the first side of the second switch.

19. The method of claim 18, wherein the first cable has a first length, the second cable has a second length, the second length being longer than the first length.

20. The method of claim 18, wherein the first switch includes a switch circuit, a first interconnect couples the first port on the front of the first switch with the switch circuit, a second interconnect couples the second port on the first side of the first switch with the switch circuit, the first interconnect having a first length, the second interconnect having a second length, the second length being shorter than the first length.

21. The network rack of claim 1, wherein the second cable is longer than the first cable and subject to no more than the same signal losses as the first cable.

22. The network rack of claim 1, wherein the first switch has a third port on the second side and the second switch has a third port on the second side and further comprising a third cable coupling the third port on the second side of the first switch with the third port on the second side of the second switch.

* * * * *